(12) United States Patent
Allegrucci et al.

(10) Patent No.: US 6,518,787 B1
(45) Date of Patent: Feb. 11, 2003

(54) INPUT/OUTPUT ARCHITECTURE FOR EFFICIENT CONFIGURATION OF PROGRAMMABLE INPUT/OUTPUT CELLS

(75) Inventors: Jean-Didier Allegrucci; Brian Fox, both of Sunnyvale, CA (US)

(73) Assignee: Triscend Corporation, Mountain View, CA (US)

( * ) Notice: Subject to any disclaimer, the term of this patent is extended or adjusted under 35 U.S.C. 154(b) by 0 days.

(21) Appl. No.: 09/668,011

(22) Filed: Sep. 21, 2000

(51) Int. Cl.$^7$ .................... H03K 19/173; H03K 19/177
(52) U.S. Cl. ............................ 326/38; 326/41
(58) Field of Search .................. 326/38, 39, 41, 326/47; 365/189.08, 63

(56) References Cited

U.S. PATENT DOCUMENTS

| | | | |
|---|---|---|---|
| 4,870,302 A | 9/1989 | Freeman | |
| 4,912,677 A | * 3/1990 | Itano et al. ............ | 365/189.08 |
| 5,140,193 A | 8/1992 | Freeman et al. | |
| RE34,363 E | 8/1993 | Freeman | |
| 5,369,314 A | 11/1994 | Patel et al. | |
| 5,398,209 A | * 3/1995 | Iwakiri et al. ......... | 365/230.03 |
| 5,448,493 A | 9/1995 | Topolewski et al. | |
| 5,635,851 A | 6/1997 | Tavana | |
| 5,682,107 A | 10/1997 | Tavana et al. | |
| 5,710,891 A | 1/1998 | Normoyle et al. | |
| 5,774,684 A | 6/1998 | Haines et al. | |
| 5,825,202 A | 10/1998 | Tavana et al. | |
| 5,869,982 A | * 2/1999 | Graf ............................ | 326/40 |
| 5,883,525 A | 3/1999 | Tavana et al. | |
| 5,942,913 A | 8/1999 | Young et al. | |
| 5,982,195 A | 11/1999 | Cliff et al. | |
| 6,107,824 A | 8/2000 | Reddy et al. | |

FOREIGN PATENT DOCUMENTS

WO   WO 00/22546 A2   4/2000

* cited by examiner

*Primary Examiner*—Michael Tokar
*Assistant Examiner*—James H. Cho
(74) *Attorney, Agent, or Firm*—Blakely, Sokoloff, Taylor & Zafman LLP

(57) ABSTRACT

A programmable input/output memory architecture. The programmable input/output memory cells are disposed in two segments about the periphery of the chip. Each segment has two data buses for separate reading and writing of the configuration register. Each cell is selected and configured according to user specifications. Corresponding memory cells from each segment share the same select line, therefore two bytes of configuration data are accessed together and the data is propagated through both segments approximately concurrently thereby reducing propagation delay.

25 Claims, 7 Drawing Sheets

WRITING TO AN IO MEMORY CELL

WAVEFORM FOR CONFIGURATION MEMORY WRITE OPERATION

READING FROM AN IO MEMORY CELL

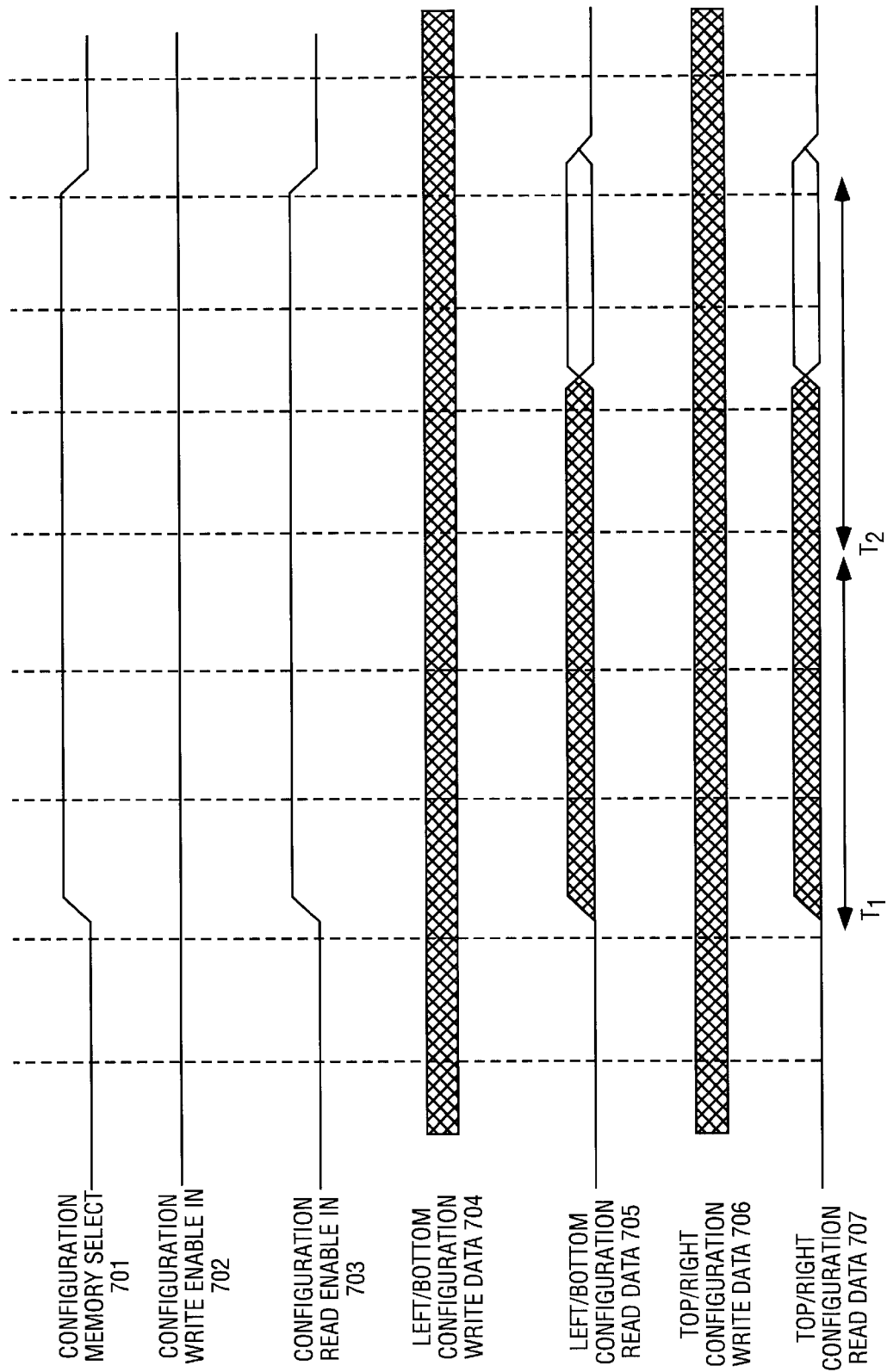

INPUT/OUTPUT ARCHITECTURE FOR EFFICIENT CONFIGURATION OF PROGRAMMABLE INPUT/OUTPUT CELLS

FIELD OF THE INVENTION

The present invention relates generally to programmable Input/Output (I/O) cells as part of a configurable system on a chip, and more specifically to an improved method of configuring the I/O cells.

BACKGROUND

Today some electronic systems and devices contain a configurable system on a chip (CSOC). A description of CSOC architecture is shown in FIG. 2 of Patent Cooperation Treaty, Patent Document No. WO 00/22546, published Apr. 20, 2000. A CSOC integrates a CPU, an internal system bus, programmable logic also referred to as configurable system logic (CSL), and various system resources all interconnected and communicating via the internal system bus on a single chip. Most CSOCs are comprised of core electronics (e.g. CPU, RAM, ROM, DMA, etc.) at their center and input/output electronics, or an I/O ring, at their periphery. The I/O cells (in this case programmable I/Os (PI/Os)) contain a bonding pad with an input buffer and an output buffer. The pad can be used as an input pin, an output pin, or a bidirectional pin. The physical location of the PI/O pad ring to the rest of the chip is shown in FIG. 1. FIG. 1 is a diagram depicting PI/O ring architecture. Shown in the chip 100 of FIG. 1 are PI/O control and configuration logic 105, a plurality of PI/O memory cells in a PI/O ring 110 placed around the edges of the chip, Read/Write control signals line 115, Read/Write data bus 125, and embedded resources 130 and chip logic 135 at the center of the chip. The PI/O ring is typically comprised of several (sometimes hundreds) of PI/O cells, one for each external signal of the system. The number of PI/O pins depends on the base device type and the package. The PI/O ring may contain several I/O cell types (e.g. input cells, output cells, tristate output cells and bidirectional cells), one for each external signal type. Typically, each PI/O contains a bidirectional I/O buffer that is programmable. The user decides the use of each pin as input, output, or bidirectional. The PI/O cells can be customized by the embedded system through configuration. The PI/O cells interface with signals from the embedded resources or the CSL. When a PI/O cell interfaces with embedded resources it is called a system pin. The embedded system controls the function and configuration of a system pin. Users can configure the electrical characteristics of a system pin, but cannot alter the function of a system pin (i.e. the user cannot change the direction, input, output, or bi-directional, of a system pin). When a PI/O cell interfaces with CSL, it is called a general PI/O pin. Users can configure both the functional and electrical characteristics of a general PI/O pin. Each PI/O cell contains a configuration register to customize the functional and electrical characteristics. For example each output buffer can be configured with high or low slew-rate. Slew-rate control provides a tradeoff between low-noise and high-speed performance. Depending on the amount of external memory connected to the device, drive or slew characteristics of the system I/O buffers might need to be modified.

The user can also select between two levels of drive current strength independent of the slew-rate. The combination of drive current strength and slew-rate control allows different grades of speed and noise immunity.

Another characteristic of which user configuration is desirable is internal weak input resistance. I/O cells of different integrated circuits (ICs) can have different electronic operating characteristics. When two or more I/O cells of different ICs are connected together through a media, the connecting net often requires some form of biasing (pull-up or pull-down) and/or termination to ensure the error-free operation of all the connected I/O cells or to guarantee no nets will be floating, providing noise immunity.

Other characteristics that can be configured include power-saving features used with the output enable and input enable during power down mode.

FIG. 2 describes the process by which a user configures the general PI/O pins. The process 200 shown in FIG. 2 begins at operations 205a and 205b. In operation 205a, starting with the PI/O control and configuration logic 105, the configuration control and data lines propagate write data through the entire ring in a counter-clockwise direction. At the same time the core logic generates individual select lines that are asserted to select the PI/O memory cells, operation 205b. In operation 210 each memory cell, in turn, receives the control and write data from the previous cell and propagates a buffered version to the next cell. The process continues around the entire ring until the data is stabilized. In operation 215 the write command is asserted and is propagated through the entire ring. Then, depending on which PI/O memory cells have been selected in operation 205b, the data will be written to the correct cell. The write command is then deasserted and propagates through the entire ring, operation 220. As FIG. 2 describes, writing to a PI/O memory cell is done in three steps (i.e. propagate data while selecting the PI/O memory cell, assert the write command, deassert the write command), and in each step the signals must propagate through the entire ring, therefore the configuration write time is 3TN where T is the time to propagate through the ring and N is the number of PI/O cells to be programmed. The process to read from a PI/O memory cell is faster, as there is no write data propagation. The reading is done in one step, the read command propagates throughout the entire ring while the read data from the selected cell propagates in the same direction from the cell. Because the read command must be propagated through the entire ring the time for the process is TN. Reading is not as time critical as writing because reading is useful mainly for debugging purposes.

SUMMARY OF THE INVENTION

A device is described having a plurality of programmable input/output memory cells configured in corresponding segments. Each cell of a segment shares a select line with a cell of each remaining segment. Control logic is coupled to the programmable input/output memory cells and data is propagated at approximately the same time from the control logic through each of the corresponding segments of input/output memory cells. The invention discloses a more efficient method of configuring programmable I/O cells without increasing the area of the cell.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 7 is a waveform diagram for a read operation.

DETAILED DESCRIPTION

A segmented architecture for the configuration of programmable input/output memory cells allows the user to complete configuration in less time without adding to the size of the chip. Configuration data is now propagated through each segment functionally concurrently.

An intended advantage of one embodiment of the invention is to segment the PI/O cells into left-bottom and top-right segments and propagate write data through the two segments at approximately the same time.

Another intended advantage of one embodiment of the invention is to provide a write data bus and a read data bus for each segment to avoid routing each segment's data across the entire chip around other subsystems.

Another intended advantage of one embodiment of the invention is to increase the size of the write data bus so that the PI/O cells can be configured in pairs of PI/O cells sharing the same select line.

Figure 1:
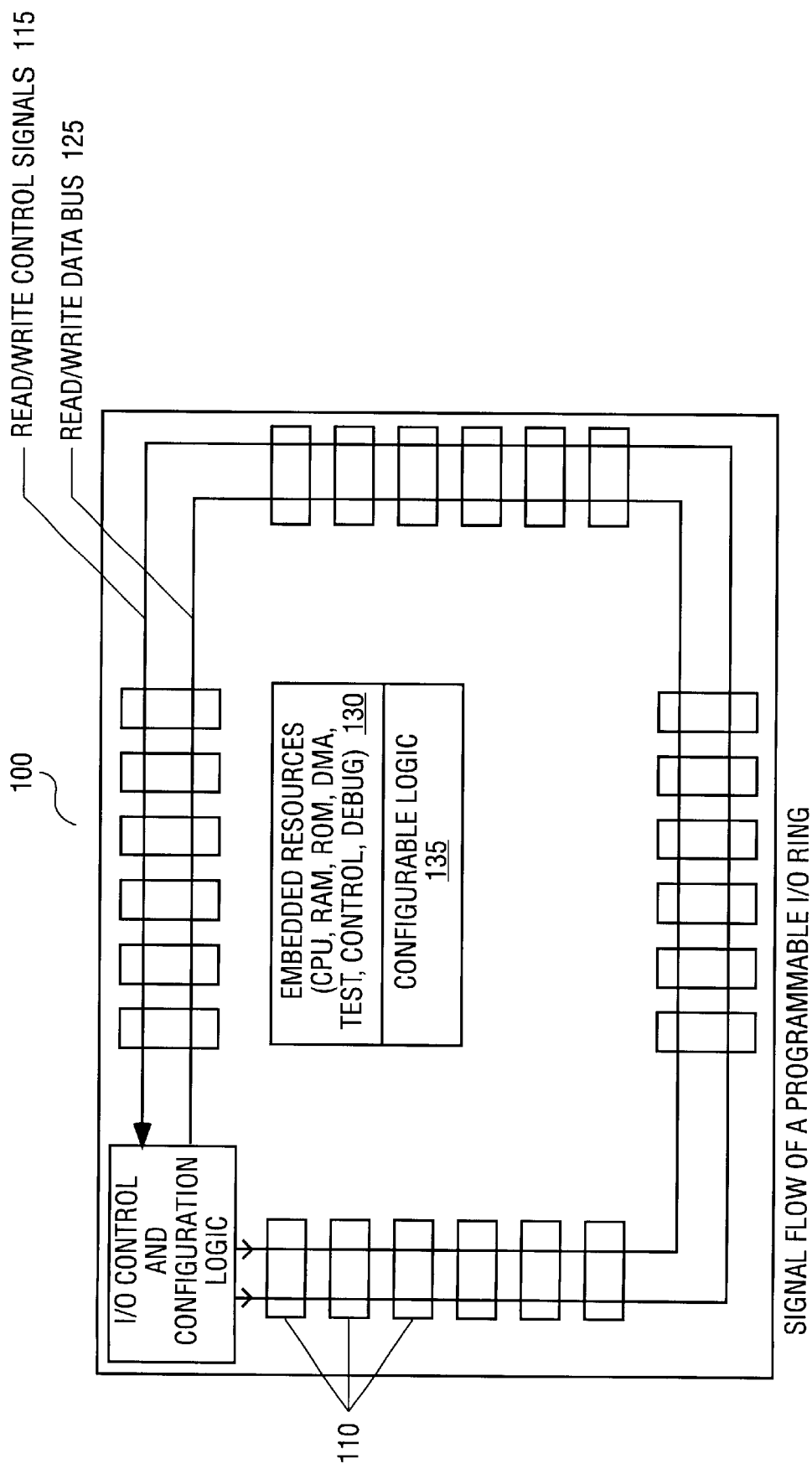
FIG. 1 is a signal flow diagram of a programmable prior art input/output ring.
Figure 2:
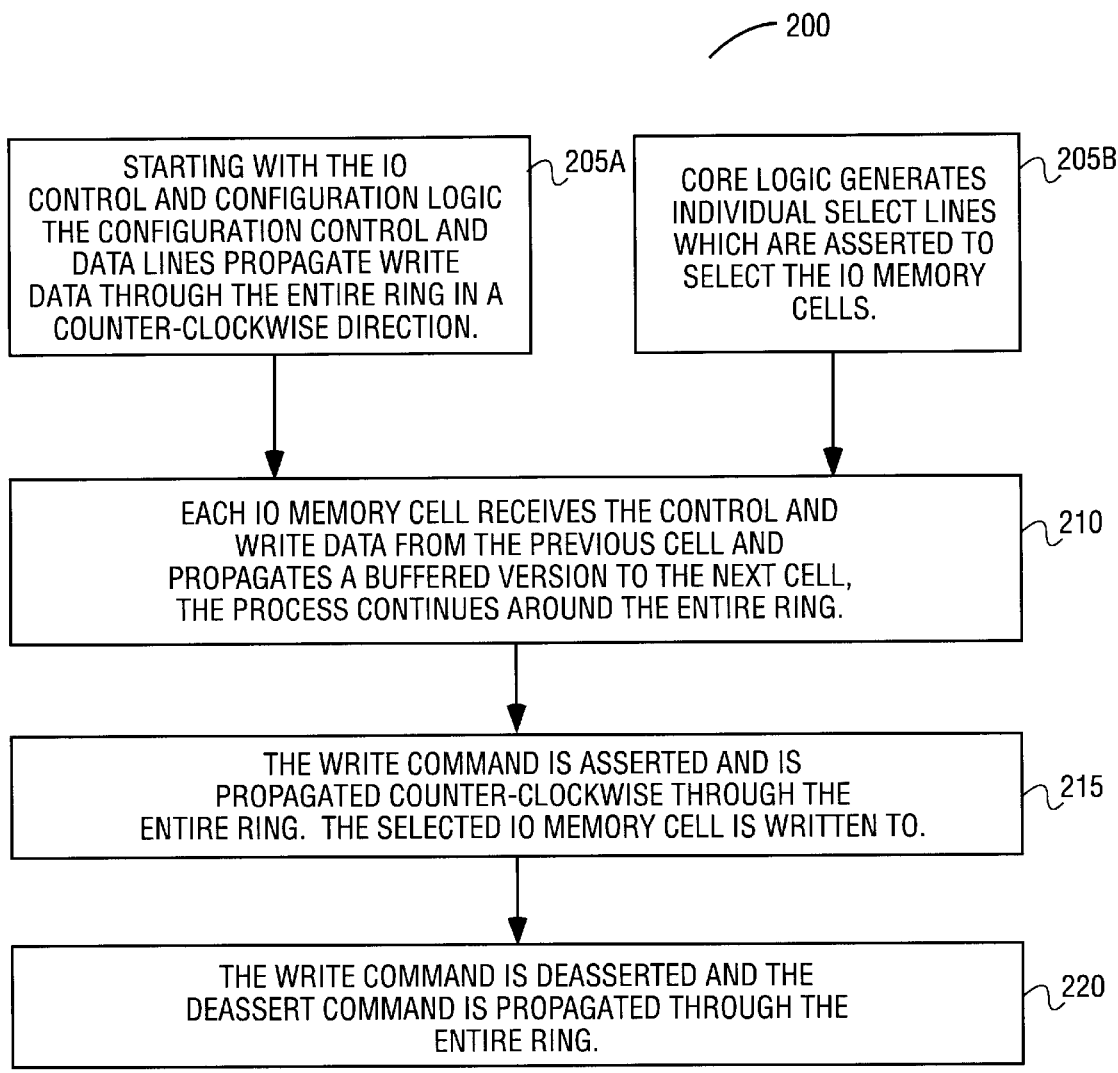
FIG. 2 is a prior art flow chart of the process by which programmable input/output memory cells are configured.
Figure 3:
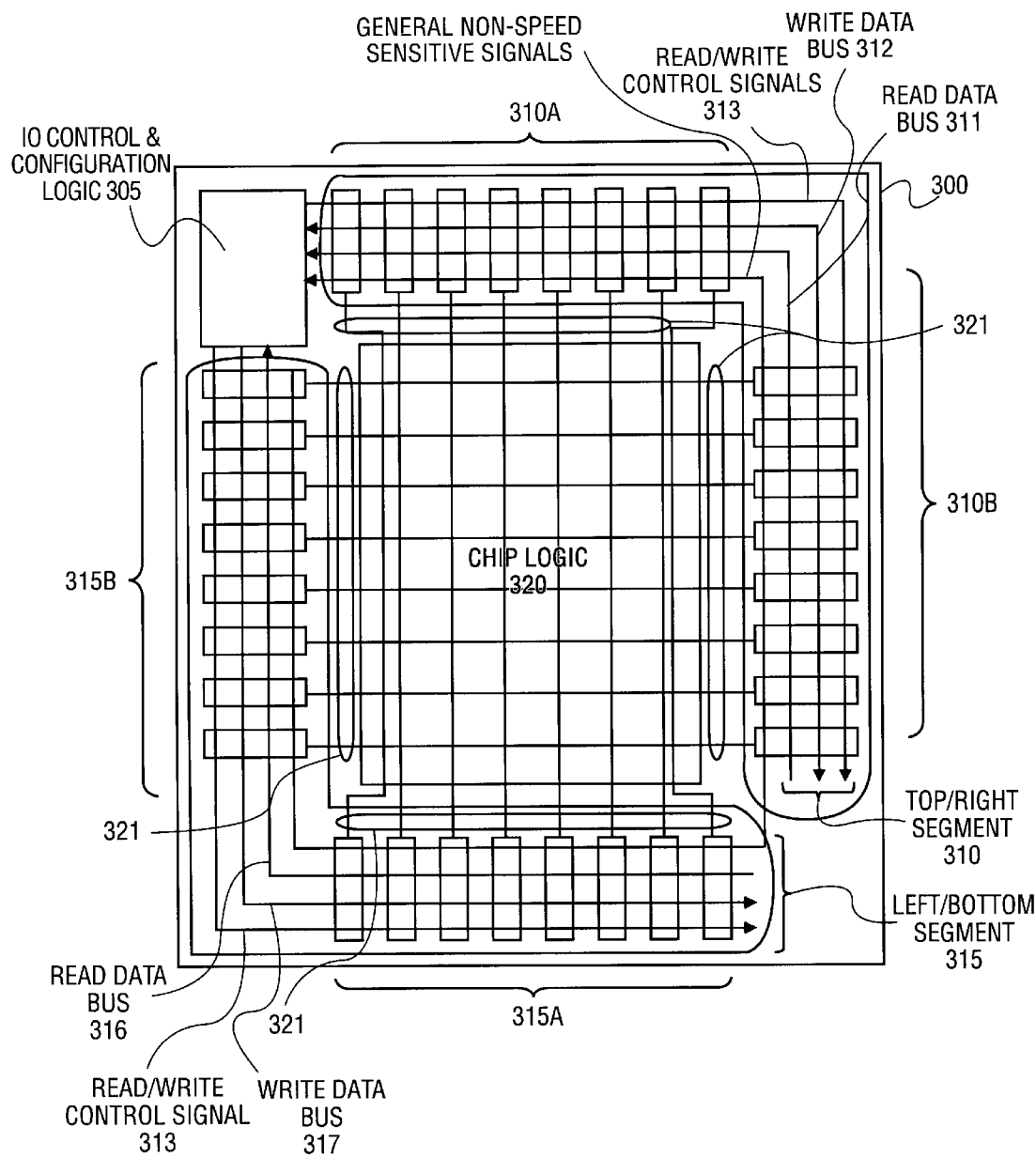
FIG. 3 is a signal flow diagram of a segmented input/output configuration architecture.

FIG. 3 is a signal flow diagram of a segmented programmable input/output (PI/O) configuration architecture 300. The PI/O system 300 includes PI/O control and configuration logic 305. The configuration logic are chained to form two segments, a top-right segment of PI/O cells 310 made up of the top PI/O cells 310a and the right PI/O cells 310b, and a left-bottom segment of PI/O cells 315 made up of the bottom PI/O cells 315a and the left PI/O cells 315b. The segment assignments are arbitrary. In the embodiment depicted in FIG. 3 the starting point is the upper right-hand corner. The upper right-hand corner was the preferred starting point for this embodiment because the dedicated resources were located in that area. Once the start is selected the two segments are naturally defined.

Each segment has a read data bus and a write data bus, that is, there is a read data bus 311, and a write data bus 312 for the top-right segment of PI/O cells 310, and a read data bus 316, and a write data bus 317 for the left-bottom segment of PI/O cells 315. At the center of the I/O system 300 is configurable system logic (CSL) 320 which is connected to the PI/O cells through select lines 321. As shown in FIG. 3, a pair of PI/O cells share each of the select lines 321 from the CSL 320. The top PI/O cells 310a are paired with the bottom PI/O cells 315a and the right PI/O cells 310b are paired with the left PI/O cells 315b.

Figure 4:
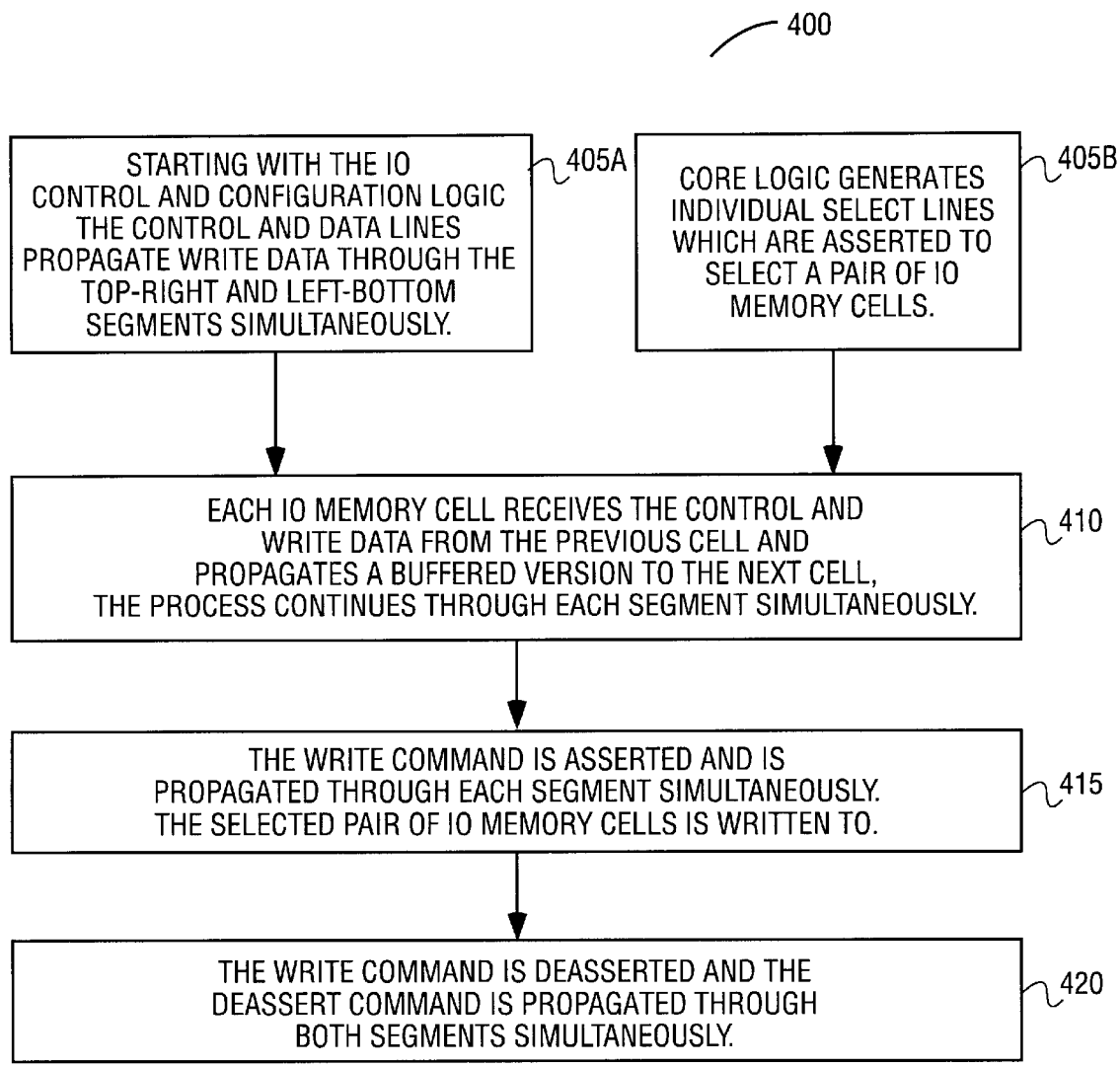
FIG. 4 is a flow chart of the process by which programmable input/output memory cells are configured according to one embodiment of the present invention.

FIG. 4 is a flow chart of the process by which programmable input/output memory cells are configured according to one embodiment of the present invention. The process 400, shown in FIG. 4 starts with operation 405a in which the PI/O control and configuration logic 305 of PI/O system 300 propagates write data through control lines 313. The data is propagated through the top-right segment of PI/O cells 310 and, functionally concurrently, through the left-bottom segment of PI/O cells 315. The write data propagates through write data bus 312 and write data bus 317. At the same time, in operation 405b, the CSL 320 generates select lines that select a pair of PI/O cells. In operation 410 each PI/O memory cell receives the write data and control data from the previous cell and propagates a buffered version to the next cell. The control lines and write data lines are connected to adjacent PI/O blocks (i.e. the write data output bus is connected to the write data input bus of the subsequent PI/O cell while the write data input bus is connected to the write data output bus of the preceding PI/O cell). In this way the data is propagated throughout each segment at approximately the same time. When the propagation process is complete and the data has become stable, the write command is asserted and is propagated through both segments at approximately the same time, the selected pair of PI/O cells is written to, operation 415. In operation 420 the write command is deasserted and the deassert command is similarly propagated through each segment at approximately the same time.

Figure 5:
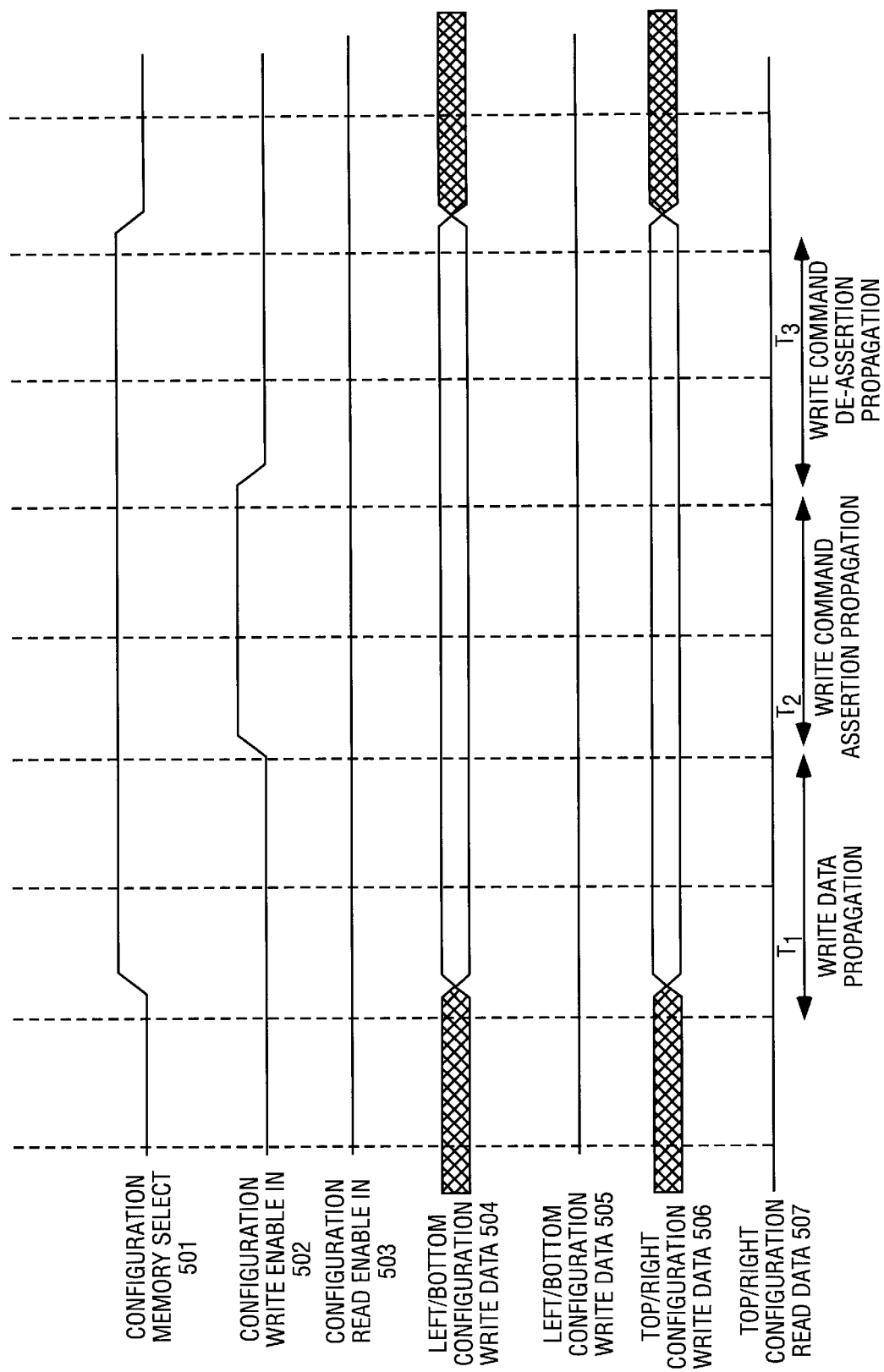
FIG. 5 is a waveform diagram for a write operation.

FIG. 5 is a waveform diagram for the write operation discussed above in reference to FIG. 4. At $T_1$ both the left-bottom configuration write data 504 and the top-right configuration write data 506 are propagated approximately concurrently. The configuration memory select is asserted at this time also and remains high throughout the write process. At $T_2$, when the propagated write data has stabilized, the configuration write enable command 502 is asserted and the I/O cells are programmed. At $T_3$ the configuration write enable command 502 is deasserted and the write operation is complete. Both the left-bottom configuration read 505 and the top-right configuration read 507 are not active during the write process. Each phase has the same number of clock cycles. The number of cycles for each phase is programmable as well. This allows the optimization of phase length for different size devices. For example, the timing of larger devices can be slowed down by increasing the phase length. The timing of smaller devices can be speeded up by decreasing the phase length. The segmented PI/O architecture could support a parallel read and write operation however, the typical system bus is not configured to allow it.

As depicted in FIGS. 4 and 5 the write operation is still completed in three steps (i.e. propagate data while selecting the PI/O memory cell, assert the write command, deassert the write command), however, with the improved segmented architecture the data does not propagate the length of the entire ring, but only the length of a segment. In the described embodiment the segment length is ½ the length of the ring. Also, the size of the system bus has been increased, and a pair of PI/O cells share the same select line (i.e. two PI/O cells can be programmed together). The two improvements together reduce configuration write time to ¼ the write time of the prior art for the same technology.

Figure 6:
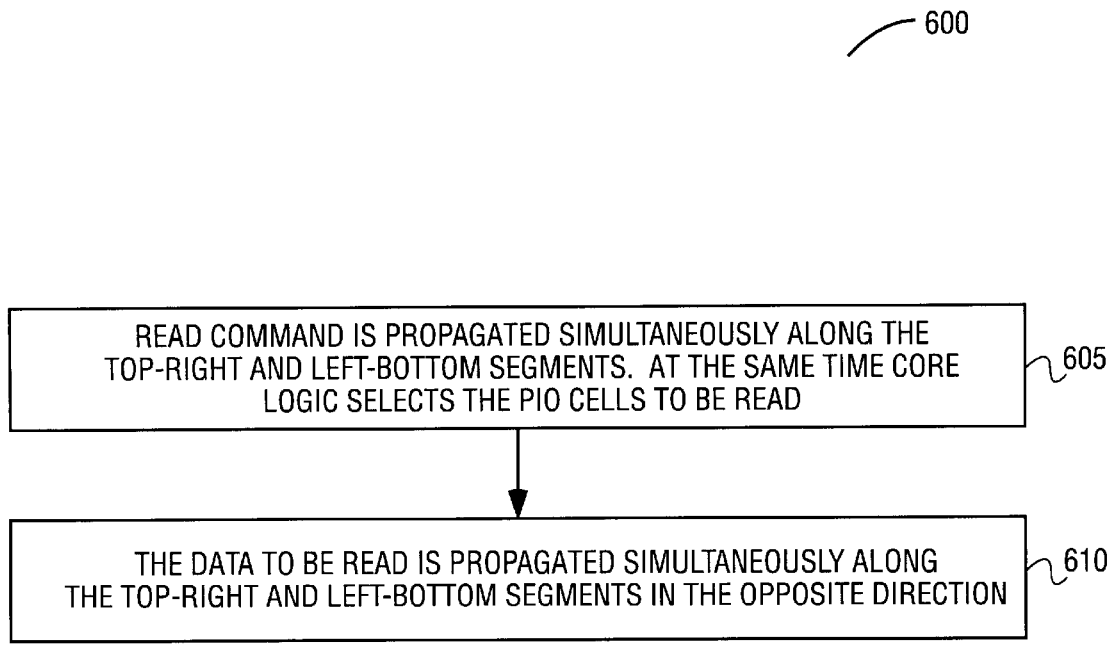
FIG. 6 is a flow chart of the process by which programmable input/output memory cells are read from according to one embodiment of the present invention.

FIG. 6 is a flow chart of the process by which programmable input/output memory cells are read from according to one embodiment of the present invention. The process 600 shown in FIG. 6 starts at operation where the read command is propagated along the top-right segment of PI/O cells 310 and the left-bottom segment of PI/O cells 315 approximately concurrently. The read command is propagated in the same manner as discussed above in reference to the write operation. At the same time that the read command is propagated along the PI/O cell segments the core logic selects the PI/O cells to be read. In operation 610 the data to be read is propagated back along the top-right segment of PI/O cells 310 and the left-bottom segment of PI/O cells 315 in the opposite direction.

FIG. 7 is a waveform diagram for the read operation discussed above in reference to FIG. 6. At $T_1$ both the left-bottom configuration read command 705 and the top-right configuration read command 707 are propagated at approximately the same time. The configuration memory select 701 is asserted at this time also and remains high throughout the read process. At $T_2$ the data to be read is propagated from the selected PI/O cells back along the top-right segment of PI/O 310 and the left-bottom segment of PI/O cells 315 in the opposite direction. Both the left-bottom configuration write 704 and the top-right configuration write 706 are not active during the read process.

As depicted in FIGS. 6 and 7 the read operation is completed in two steps, propagating the read command along both segments to the PI/O cells to be read at approximately the same time and propagating the read data back along both segments in the opposite direction. The read data from the last PI/O cell of a segment is available after propagating through the segment twice (once for the read command and once for the read data), which is equivalent to propagation time throughout the entire ring of the PI/O ring architecture. However, because two PI/O cells are read in one read operation the read operation time is reduced at least by half.

In the foregoing detailed description, the methods and apparatuses of the present invention have been described with reference to specific exemplary embodiments. It should be understood that the methods and apparatuses of the invention can be practiced with modification and alteration within the spirit and scope of the appended claims. The description is thus to be regarded as illustrative instead of limiting on the invention.

What is claimed is:

1. An input/output device comprising:
   a plurality of memory cells configured in a plurality of corresponding data propagation segments of at least one memory cell each; and
   control logic coupled to the plurality of memory cells such that data propagated from the control logic through the memory cells is propagated approximately concurrently through each of the corresponding data propagation segments.

2. The device of claim 1, wherein the plurality of memory cells are configured in two corresponding segments.

3. The device of claim 2, wherein the two segments are a top-right segment and a bottom-left segment.

4. The device of claim 1, wherein the memory cells are programmable input/output memory cells.

5. The device of claim 4, further comprising a write data bus and a read data bus for each segment.

6. The device of claim 1, wherein each memory cell of each corresponding segment shares a select line with corresponding memory cells of the corresponding segments.

7. The device of claim 6, wherein the programmable input/output memory cells are part of a configurable system on a chip.

8. The device of claim 1, wherein the data is command data.

9. The device of claim 1, wherein a phase length is programmable.

10. A method of programming input/output memory cells comprising:
    providing a plurality of memory cells configured in a plurality of corresponding data propagation segments of at least one memory cell; and
    propagating data through the corresponding segments of the input/output memory cells approximately concurrently.

11. The method of claim 10, wherein providing includes providing control logic coupled to the plurality of memory cells such that data propagated from the control logic through the memory cells is propagated approximately concurrently through corresponding segments.

12. The method of claim 11, wherein providing further includes providing select lines such that each memory cell of each segment shares the same select line as the corresponding memory cells of the corresponding segments.

13. The method of claim 10, wherein the number of corresponding segments is two.

14. The method of claim 13, wherein the two corresponding segments are a top-right segment and a bottom-left segment.

15. The method of claim 10, wherein the memory cells are programmable input/output memory cells.

16. The method of claim 15, wherein providing further includes providing a write data bus and a read data bus for each segment.

17. The method of claim 10, wherein each memory cell of each corresponding segment shares a select line with corresponding memory cells of the corresponding segments.

18. The method of claim 17, wherein the programmable input/output memory cells are part of a configurable system on a chip.

19. The method of claim 10, wherein a phase length is programmable.

20. A method of reading data from programmable input/output memory cells comprising:
    providing a plurality of memory cells configured in a plurality of corresponding data propagation segments of at least one memory cell;
    selecting programmable input/output memory cells to read;
    propagating read command data through the corresponding segments of the input/output memory cells approximately concurrently to the selected programmable input/output memory cells; and
    propagating the data from the selected programmable input/output memory cells back through the corresponding segments of the input/output memory cells.

21. The method of claim 20, wherein the data is programmable input/output configuration data.

22. The method of claim 21, wherein providing further includes providing select lines such that each memory cell of each segment shares a select line as the corresponding memory cells of the corresponding segments.

23. The method of claim 20, wherein the number of corresponding segments is two.

24. The method of claim 23, wherein the two corresponding segments are a top-right segment and a bottom-left segment.

25. The device of claim 20, wherein a phase length is programmable.

* * * * *